United States Patent [19]

Benoit-Gonin et al.

[11] 4,398,099
[45] Aug. 9, 1983

[54] SWITCHED-CAPACITANCE AMPLIFIER, A SWITCHED-CAPACITANCE FILTER AND A CHARGE-TRANSFER FILTER COMPRISING AN AMPLIFIER OF THIS TYPE

[75] Inventors: Roger Benoit-Gonin; Jean-Luc Berger; Jean-Louis Coutures; Daniel Forster; Jean-Edgar Picquendar, all of Paris, France

[73] Assignee: Thomson-CSF, Paris, France

[21] Appl. No.: 375,680

[22] Filed: May 6, 1982

Related U.S. Application Data

[63] Continuation of Ser. No. 77,348, Sep. 20, 1979, abandoned.

[30] Foreign Application Priority Data

Sep. 26, 1978 [FR] France ............................... 78 27505

[51] Int. Cl.³ .......................................... H03K 17/56
[52] U.S. Cl. .................................. 307/246; 307/494; 307/496; 307/501; 307/594; 363/60
[58] Field of Search ............... 307/246, 490, 491, 493, 307/494, 495, 496, 501, 594, 595, 221 C, 492, 497; 363/59, 60

[56] References Cited

U.S. PATENT DOCUMENTS

| | | | |
|---|---|---|---|
| 3,737,683 | 6/1973 | Sangster | 307/246 |
| 4,106,086 | 8/1978 | Holbrook | 363/60 |
| 4,137,464 | 1/1979 | Heller et al. | 307/246 |
| 4,186,436 | 1/1980 | Ishiwatari | 363/60 |
| 4,275,437 | 6/1981 | Boll et al. | 363/60 |

*Primary Examiner*—Saxfield Chatmon, Jr.
*Attorney, Agent, or Firm*—Roland Plottel

[57] ABSTRACT

The switched-capacitance amplifier comprises n capacitors $C_{11}$ to $C_{1n}$ which are periodically switched in parallel and in series, the n parallel-switched capacitors being charged simultaneously by the same voltage $V_E$. An amplified voltage $n \times V_E$ is obtained between the end terminals A and B of the n series-switched capacitors. Periodic switching of the n capacitors in parallel and in series is performed by means of MOS transistors $T_{11}$ to $T_{1(2n-1)}$ and $T_{21}$ to $T_{2(n-1)}$ which operate in the switching mode. The n capacitors and the MOS transistors are integrated on the same semiconductor substrate.

11 Claims, 12 Drawing Figures

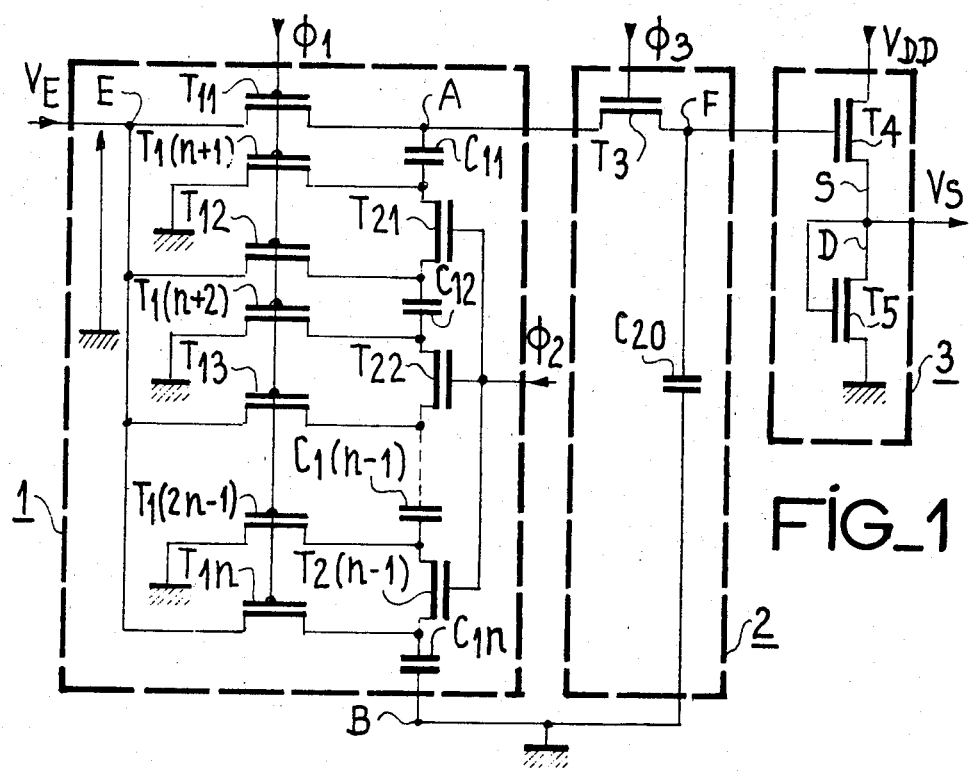
FIG_1
FIG_2
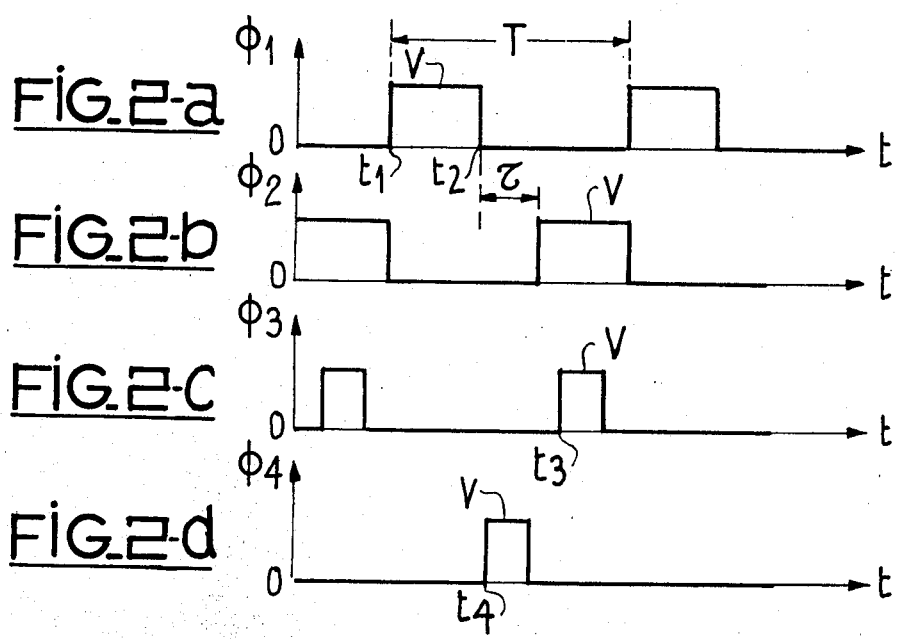
FIG_2-a
FIG_2-b
FIG_2-c
FIG_2-d

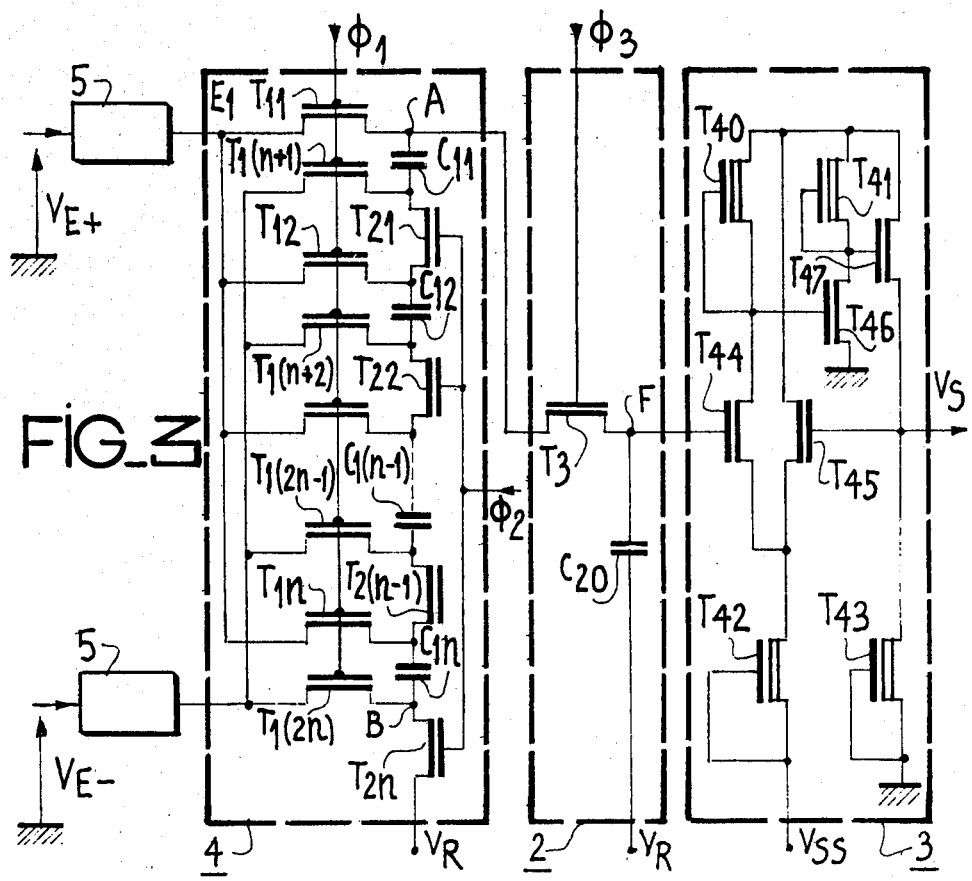
FIG_3
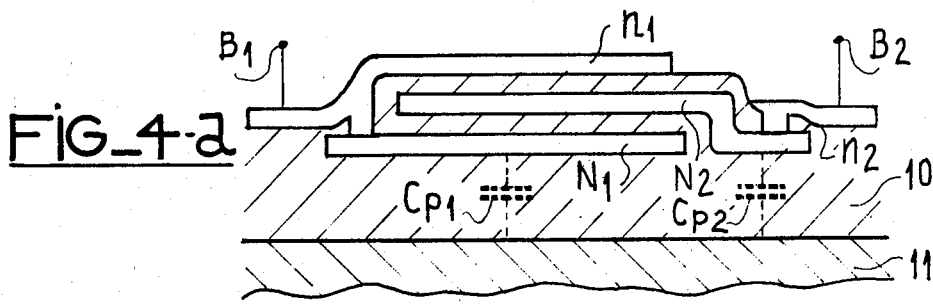
FIG_4
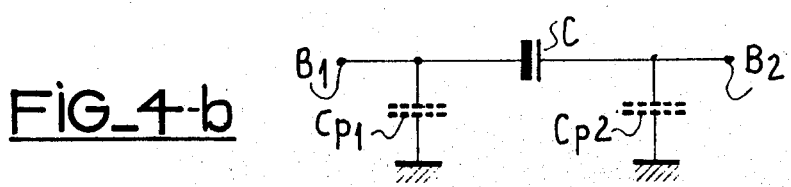
FIG_4-a
FIG_4-b

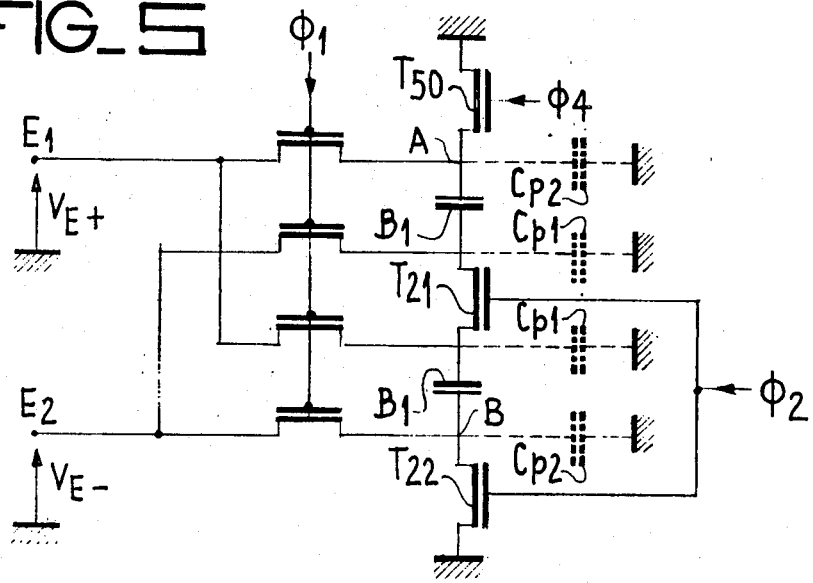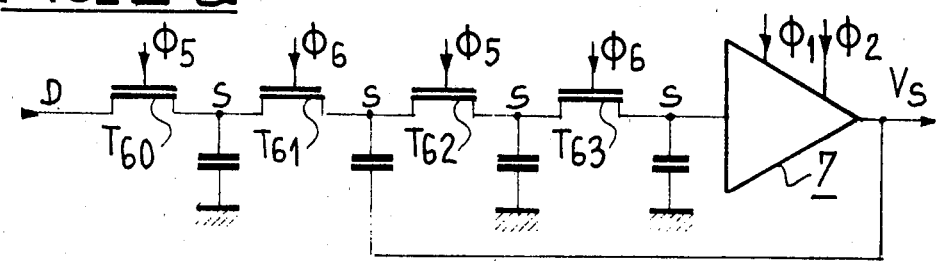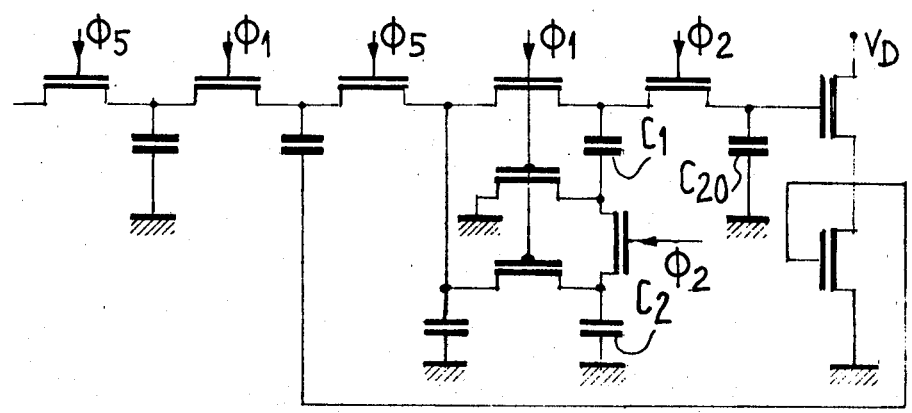

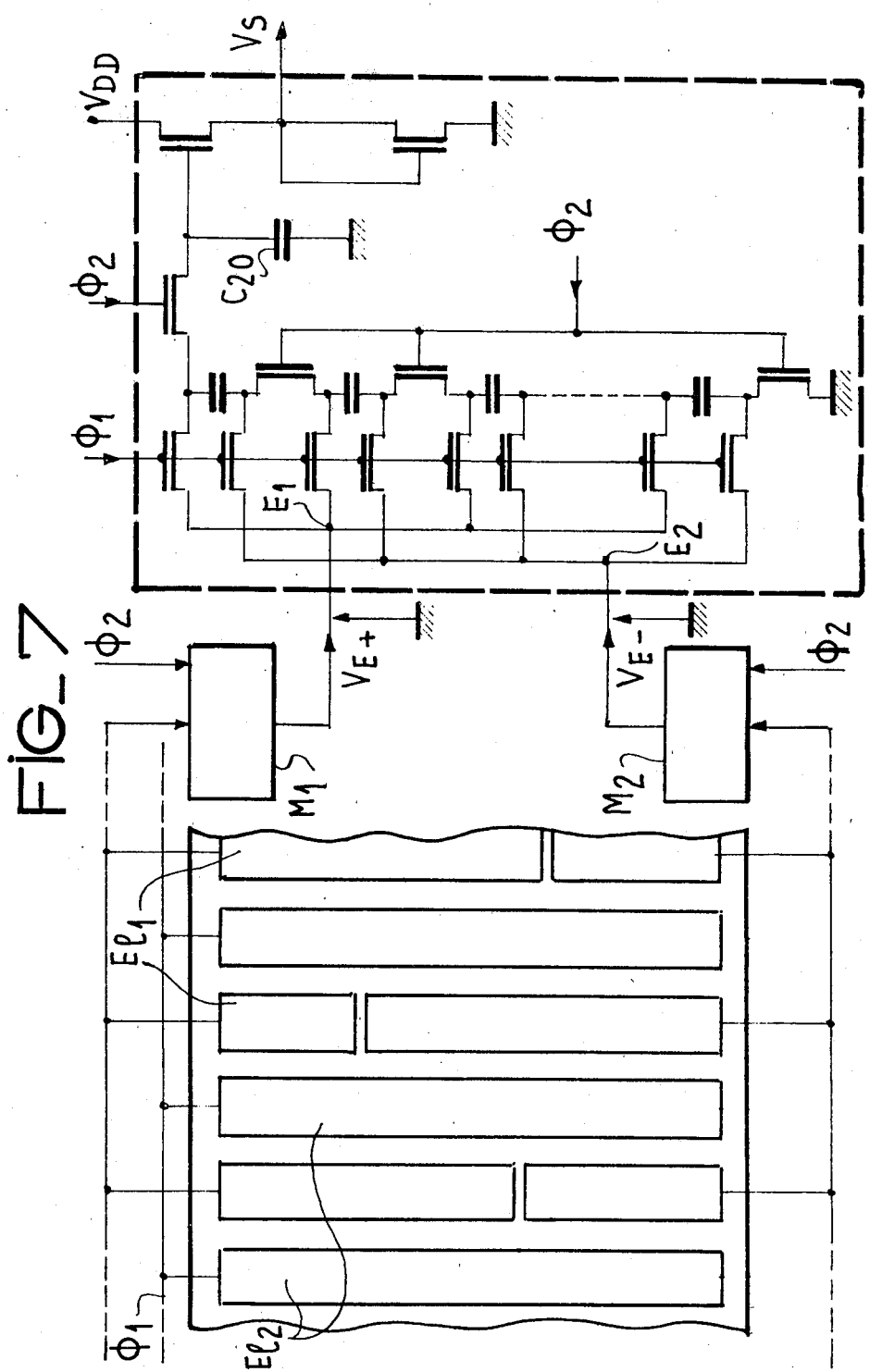
FIG_7

SWITCHED-CAPACITANCE AMPLIFIER, A SWITCHED-CAPACITANCE FILTER AND A CHARGE-TRANSFER FILTER COMPRISING AN AMPLIFIER OF THIS TYPE

This application is a continuation of application Ser. No. 77,348, filed Sept. 20, 1979, now abandoned.

This invention relates to a switched-capacitance amplifier as well as to switched-capacitance filters and to charge-transfer filters which incorporate an amplifier of this type.

Switched-capacitance filters have been described in particular in two articles published in the American review entitled "Proceedings of the Institute of Electrical and Electronics Engineers", volume SC 12—No 6—December 1977—pages 592 to 608, and "International symposium on circuits and systems proceedings'-'—April 1977—pages 525 to 529.

Switched-capacitance filters are essentially composed of a filter cell and of an amplifier. The filter cell which is integrated has the same properties as a conventional filter cell constituted by resistors and capacitors but consists only of capacitors and MOS transistors. The resistors are replaced by a combination of MOS transistors and of capacitors, thus making it possible in particular to reduce their dimensional requirements as well as to obtain higher temperature stability and better linearity. The amplifier which is associated with the filter cell must have a very stable and well-defined gain. An operational amplifier is usually employed.

The disadvantage of this amplifier lies in the fact that it cannot readily be integrated on the same substrate as the filter cell and also in the fact that it has high power consumption.

The switched-capacitance amplifier in accordance with the invention utilizes the same technology as the filter cell since it is composed solely of capacitors and of MOS transistors and can be readily integrated with this latter. Said amplifier has the further advantage of a very stable and well-defined gain as well as a low power consumption.

The present invention relates to a switched-capacitance amplifier comprising n periodically switched capacitors in parallel and in series: a single voltage charges simultaneously the n capacitors which are switched in parallel; an amplified voltage is obtained between the end terminals A and B of the n capacitors which are switched in series. Periodic switching of the n capacitors in parallel and in series is carried out by MOS transistors operating in the switching mode, the n capacitors and the transistors being integrated on the same semiconductor substrate.

This invention relates to a single-input switched-capacitance amplifier and to a switched-capacitance differential amplifier.

Further objects, distinctive features and results of the invention will be brought out by the following description which is given by way of example and not in any limiting sense, reference being made to the accompanying drawings in which:

FIG. 1 illustrates one embodiment of the switched-capacitance amplifier according to the invention;

FIGS. 2a, 2b, 2c, 2d are phase diagrams of signals applied to an amplifier according to the invention;

FIG. 3 illustrates one embodiment of a switched-capacitance differential amplifier according to the invention;

FIGS. 4a and 4b show respectively a sectional view of an integrated capacitor and the electrical diagram which is equivalent to this latter;

FIG. 5 shows another embodiment of a switched-capacitance differential amplifier according to the invention;

FIGS. 6a and 6b show an embodiment of a switched-capacitance filter comprising a switched-capacitance amplifier according to the invention;

FIG. 7 shows an embodiment of a charge-transfer filter comprising a switched-capacitance differential amplifier according to the invention.

The same references designate the same elements in the different figures in which the dimensions and proportions of the different elements have not been complied with.

FIG. 1 shows one embodiment of a switched-capacitance amplifier according to the invention.

Let $C_{11}, C_{12} \ldots C_{1n}$ designate the n capacitors to be switched periodically from parallel to series and conversely.

The drains and sources of (n−1) MOS transistors, also referred-to as TMOS transistors, $T_{21}$ to $T_{2(n-1)}$ are connected between the terminals of two successive capacitors, only the two end terminals of which are left free, namely terminal A of capacitor $C_{11}$ and terminal B of capacitor $C_{1n}$.

The drains and sources of n MOS transistors $T_{11}$ to $T_{1n}$ are connected between one of the terminals of each capacitor including the end terminal A, and the input E to which is applied a voltage $V_E$.

The drains and sources of (n−1) MOS transistors $T_{1(n+1)}$ to $T_{1(2n-1)}$ are connected between the other terminal of each capacitor and ground except for the terminal B which is connected directly to ground.

The MOS transistors are driven by two periodic signals $\phi_1$ and $\phi_2$ applied respectively to the gates of transistors $T_{11}$ to $T_{1(2n-1)}$ forming part of a first group of transistors $G_1$, and of transistors $T_{21}$ to $T_{2(n-1)}$ forming part of a second group of transistors $G_2$.

FIGS. 2a and 2b are phase diagrams of the periodic signals $\phi_1$ and $\phi_2$.

Said diagrams (a) and (b) represent the potentials $\phi_1$ and $\phi_2$ the amplitude of which is rising from 0 to V, in volts, with a period T; the potentials $\phi_1$ and $\phi_2$ are never at V simultaneously.

The transition of $\phi_1$ from V to 0 is separated from the transition of $\phi_2$ from 0 to V by a non-zero time interval $\tau$.

The operation of the device described earlier, as designated by the reference 1 and shown in dashed outline in FIG. 1 is as follows:

at the instant $t_1$, the signal $\phi_1$ assumes the value V which initiates conduction of the TMOS transistors $T_{11}$ to $T_{1(2n-1)}$. The voltage $V_E$ then charges the n capacitors in parallel through the TMOS transistors $T_{11}$ to $T_{1n}$. One terminal of these capacitors is maintained at the reference potential by means of the TMOS transistors $T_{1(n+1)}$ to $T_{1(2n-1)}$;

at the instant $t_2$, the signal $\phi_1$ assumes the value 0 which has the effect of turning-off the TMOS transistors of the first group, whereupon the n capacitors are charged at the voltage $V_E$;

after a non-zero time interval $\tau$ and in order to ensure that the TMOS transistors of both groups are not caused to conduct simultaneously, the signal $\phi_2$ changes to V and initiates conduction of the TMOS transistors $T_{21}$ to $T_{2(n-1)}$. The n capacitors are then in series and the voltage between the node A and ground is $n \times V_E$.

The first group of TMOS transistors therefore serves to switch the n capacitors in parallel and the second group of TMOS transistors serve to switch these latter in series.

The drain and the source of a TMOS transistor $T_3$ is connected between the end terminal A and a node F. A capacitor $C_{20}$ is connected between the node F and the potential to which the node B is brought when the n capacitors are in series, namely ground potential in this case.

The TMOS transistor $T_3$ is driven by a periodic signal $\phi_3$ applied to the gate of said transistor. The potential $\phi_3$ shown in FIG. 2c raises from 0 to V in volts with a period T in the same manner as $\phi_1$ and $\phi_2$. The potential $\phi_3$ changes to V during the time interval in which the potential $\phi_2$ is at V. The potential $\phi_3$ can coincide with $\phi_2$.

The device described in the foregoing is designated by the reference numeral 2 and shown in dashed outline in FIG. 1.

At the instant $t_3$, when the potential $\phi_3$ changes to V, the TMOS transistor $T_3$ is turned on and the voltage $n \times V_E$ at the node A is transmitted to the node F. The capacitor $C_{20}$ serves to adjust the gain of the amplifier and to hold the information.

The voltage at F at the instant $t_3$ is given by writing the charge storage in the capacitors between $t_2 + \tau$ and $t_3$ and, in the case in which the n capacitors have the same value C, by:

$$V_F = V_E \cdot \frac{n}{1 + n\frac{C_{20}}{C}}$$

An output stage which makes it possible to obtain the amplified voltage at a medium value of impedance is connected to the node F. In FIG. 1, said stage is designated by the reference numeral 3 and shown in dashed outline.

In FIG. 1, the output stage is constituted, for example, by a follower stage comprising two series-connected TMOS transistors $T_4$ and $T_5$. The input to the follower stage is established through the gate of transistor $T_4$, the drain of $T_4$ being supplied with a voltage $V_{DD}$ and the output is established through the source of $T_4$ to which are connected the gate and the drain of $T_5$, the source of $T_5$ being connected to ground.

The gain of the follower stage is written:

$$G_s = \frac{1}{1 + \sqrt{\frac{(W/L)5}{(W/L)4}}}$$

(W/L) 5,4 being the ratio of width to length of the MOS channel of the TMOS transistors $T_5$ and $T_4$.

The net gain of the amplifier is therefore:

$$g = \frac{n}{1 + \frac{n C_{20}}{C}} \cdot \frac{1}{1 + \sqrt{\frac{(W/L)5}{(W/L)4}}}$$

This gain is therefore continuously adjustable by varying the capacitance $C_{20}$ and is of maximum value when the capacitance $C_{20}$ is reduced to the gate capacitance of the TMOS transistor $T_4$. Said gain is dependent on the ratio of capacitances $C_{20}/C$, on the geometry of the TMOS transistors $T_4$ and $T_5$ and on the number of capacitors.

The output stage can be connected directly at A. The TMOS transistor $T_3$ is therefore dispensed with. In this case, the gain is of maximum value. However, the capacitor $C_{20}$ can be maintained between node A and node B in order to adjust the gain. In this case the capacitors $C_{11}$ and $C_{20}$ are charged in parallel from $t_1$ to $t_2$ by the TMOS transistor $T_{11}$. The expression of the voltage at A without the TMOS transistor $T_3$ and with the capacitor $C_{20}$ is written:

$$V_A = V_E \cdot \frac{n\left(1 + \frac{C_{20}}{C}\right)}{1 + n\frac{C_{20}}{C}}$$

FIG. 3 shows one embodiment of a switched-capacitance differential amplifier according to the invention.

As in FIG. 1, the drains and the sources of (n−1) TMOS transistors $T_{21}$ to $T_{2(n-1)}$ are connected between the terminals of two successive capacitors except for the end terminals A and B. In this case, an $n^{th}$ TMOS transistor $T_{2n}$ is connected between the terminal B and a reference voltage $V_R$ which can be ground.

As in FIG. 1, the drains and the sources of n TMOS transistors $T_{11}$ to $T_{1n}$ are connected between one of the terminals of each capacitor including the end terminal A, and an input $E_1$ to which is applied a voltage $V_{E+}$.

In this case, the drains and the sources of n TMOS transistors $T_{1(N+1)}$ to $T_{1(2n)}$ are connected between the other terminal of each capacitor including the end terminal B, and a second input $E_2$ to which is applied a voltage $V_{E-}$.

The TMOS transistors $T_{11}$ to $T_{1(2n)}$ and the TMOS transistors $T_{21}$ to $T_{2n}$ are driven by periodic signals $\phi_1$ and $\phi_2$ which are identical with those shown in FIGS. 2a and 2b.

The device described in the foregoing is designated by the reference numeral 4 and shown in dashed outline in FIG. 3.

From $t_1$ to $t_2$, the n parallel-connected capacitors are no longer charged to the value $V_E$ but from $V_{E+} - V_{E-}$.

At the instant $t_2 + \tau$, the voltage at A is equal to $n(V_{E+} - V_{E-}) - V_R$ since the TMOS transistor $T_{2n}$ connects the node B to a reference voltage $V_R$.

At the node A, it is possible to connect a unit which is identical with that shown in FIG. 1 and designated by the reference numeral 2. Said unit comprises a TMOS transistor $T_3$ between A and F and a capacitor $C_{20}$ between F and the voltage to which the node B is brought when the capacitors are in series, which is $V_R$ in this case.

The voltage $V_F$ at F and at the instant $t_3$ is given by writing the capacitor charge storage as follows:

$$V_F = \frac{n(V_{E+} - V_{E-})}{1 + n\frac{C_{20}}{C}} + \frac{V_R n\frac{C_{20}}{C}}{1 + n\frac{C_{20}}{C}}$$

The first term of the expression of $V_F$ is therefore similar to the expression of $V_F$ in the case of the amplifier shown in FIG. 1. The second term makes it possible to adjust the offset voltage.

An output stage for obtaining the amplified voltage at a medium value of impedance can be connected to the node F or directly to the node A.

The output stage can be a follower stage which is similar to that shown in FIG. 1 but can also be a conventional unity-gain circuit as shown in FIG. 3 comprising TMOS depletion transistors $T_{40}$, $T_{41}$, $T_{42}$, $T_{43}$ and TMOS enrichment transistors $T_{44}$, $T_{45}$, $T_{46}$, $T_{47}$. Temperature stability is further enhanced but there is an increase in dissipated power and surface area.

Both in the case of FIG. 1 and in the case of FIG. 3, the inputs of the amplifier according to the invention are not strictly high-impedance inputs since it is necessary to charge the n capacitors in parallel from $t_1$ to $t_2$. As a general rule, the capacitors are of low value since they have to be integrated on the same substrate as the TMOS transistors. An input stage which can be a follower stage of a type similar to that shown in FIG. 1 and designated by the reference numeral 3 can be placed upstream of each amplifier input in order to obtain a very-high-impedance input. These follower stages are represented schematically by rectangles in FIG. 3 and designated by the reference numeral 5.

FIGS. 4a and 4b are sectional views of an integrated capacitor and the electrical diagram which is associated with this latter.

The capacitor is fabricated in accordance with a technology involving the use of two levels $N_1$ and $N_2$ of polycrystalline silicon and an aluminum level divided into two portions $n_1$ and $n_2$ insulated by an oxide layer 10.

One capacitor plate connected to terminal $B_1$ is formed by the assembly consisting of silicon $N_1$ and aluminum $n_1$ whilst the other capacitor plate connected to terminal $B_2$ is formed by the assembly consisting of silicon $N_2$ and aluminum $n_2$.

The oxide layers which separate the different metal deposits are of small thickness compared with the oxide layer 10 which separates them from the substrate. The presence of the semiconductor substrate 11 which carries the oxide layer and which usually serves as a potential reference introduces not-negligible stray capacitances $C_{p1}$ and $C_{p2}$ on the terminals $B_1$ and $B_2$ of the capacitor C, said stray capacitances being shown in dashed lines in FIG. 4a.

The values of $C_{p1}$ and $C_{p2}$ are different: the value of $C_{p1}$ is proportional to the value of the realized capacitance C whilst the value $C_{p2}$ is fixed and usually very much lower than $C_{p1}$. In FIG. 4b, the plate of the capacitor C which is connected to the terminal $B_1$ is shown as a thick line and the plate of the capacitor C which is connected to the terminal $B_2$ is shown as a thin line.

The stray capacitances are particularly troublesome in switched-capacitance differential amplifiers since, in addition to a reduction in gain, they introduce a substantial increase in the common mode.

There is shown in FIG. 5 one embodiment of a differential amplifier having two switched capacitances in which there is a decrease in the gain reduction and in which the common mode resulting from stray capacitances is suppressed.

As was the case in FIG. 4b, the plates of each capacitor have been represented in this figure in one thick line and one thin line, and the stray capacitances associated with the two capacitances to be switched are shown in dashed lines; both capacitances have the same value C and their stray capacitances $C_{p1}$ and $C_{p2}$ are therefore the same.

This embodiment differs from that shown in FIG. 3 since:

the drain and the source of the TMOS transistor $T_{21}$ of the second group are necessarily connected to two terminals having the same name $B_1$ or $B_2$;

a TMOS transistor $T_{50}$ is connected between the end terminal A and ground and driven by a periodic signal $\phi_4$ applied to the transistor gate;

the reference voltage $V_R$ is ground.

The signal $\phi_4$ shown in FIG. 2d, as $\phi_1$, $\phi_2$, $\phi_3$, rises from 0 to V in volts with a period T. The signal $\phi_4$ changes to the value V between $t_2$ and $t_2 + \tau$ whereas the two capacitors are isolated from each other.

At the instant $t_1$, the two capacitors C are charged to $V_{E+} - V_{E-}$ whilst the stray capacitances $C_{p1}$ and $C_{p2}$ are charged to $V_{E+}$ or to $V_{E-}$ according as the terminal at which they appear is connected either to $E_1$ or to $E_2$.

At the instant $t_4$, the signal $\phi_4$ changes to V and triggers the TMOS transistor $T_{50}$ into conduction, the stray capacitance of the terminal of capacitor $C_1$ connected at A is charged the signal $\phi_4$ reverts to 0 before $t_2 + \tau$.

At the instant $t_2 + \tau$, the two capacitors are placed in series and the stray capacitance of the terminal of capacitor C which is connected to the node B is thus discharged by $T_{22}$.

In this embodiment, the voltage at A at the instant $t_3$ is proportional to $V_{E+} - V_{E-}$ $$V_A = K \cdot [V_{E+} - V_{E-}]$$

If the stray capacitance at A is of very small value compared with C as is generally the case with $C_{p2}$, then $V_A$ is written:

$$V_A = \frac{2 + \alpha}{1 + 2\alpha} \cdot [V_{E+} - V_{E-}] \text{ with } \alpha = \frac{C_p}{C}$$

$C_p$ is the stray capacitance of the capacitors C other than the stray capacitance at A.

The stages connected to the node A and before the inputs $E_1$ and $E_2$ are the same as those employed in the case of a differential amplifier of the type shown in FIG. 3.

FIGS. 6a and 6b illustrate a switched-capacitance filter comprising a switched-capacitance amplifier in accordance with the invention.

In these figures, a filter of the low-pass type is taken as an example.

In FIG. 6a, said filter is formed by connecting a switched-capacitance filter cell in series with a single-input switched-capacitance amplifier shown diagrammatically and designated by the reference numeral 7, the output of the amplifier being connected to the cell in a feedback loop. The gain of the amplifier must be between 1 and 2, thus limiting the number of capacitances to be switched to two. The filter cell comprises four series-connected TMOS transistors $T_{60}$, $T_{61}$, $T_{62}$, $T_{63}$, the input being established on the drain of $T_{60}$ and the output being established on the source of $T_{63}$. A capacitor is connected between the source of $T_{60}$, $T_{62}$, $T_{63}$ and ground and between the source of $T_{61}$ and the output of the amplifier. At least four periodic signals are necessary for operation, namely two signals for the filter cell $\phi_5$ and $\phi_6$ and two signals for the amplifier $\phi_1$ and $\phi_2$.

In FIG. 6b, there is shown a diagram of the filter of FIG. 6a in which the last capacitor of the cell coincides with the two amplifier capacitors $C_1$ and $C_2$ to be switched. Only three periodic signals are then necessary.

This filter of the second order which is entirely constituted by switched capacitances can be placed as a pre- and post-filtering cell of a charge-transfer transversal filter. The filter can then be controlled by the same periodic signals as the charge-transfer circuit.

FIG. 7 shows a charge-transfer filter which makes use of a switched-capacitance amplifier according to the invention.

A charge-transfer filter comprises:

a semiconductor substrate;

an insulating layer deposited on the substrate;

electrodes deposited on the insulating layer and constituted alternately by electrodes $El_1$ which are cut into two portions and by uncut electrodes $El_2$ for effecting the transfer of charges in the semiconductor by applying given potentials;

reading means $M_1$ and $M_2$ of quantities of charges which are present beneath the two portions of the cut electrodes, said means are known in the prior art;

a differential amplifier formed on the same semiconductor substrate as the remainder of the filter, which receives on its two inputs $E_1$ and $E_2$ the voltages $V_E+$ and $V_E-$ which are delivered by the reading means and serve to produce the output voltage $V_s$ of the filter.

In FIG. 7, the differential amplifier is a switched-capacitance differential amplifier. The periodic signals $\phi_1, \phi_2, \phi_3$ can be identique with signals employed in the operation of the charge-transfer device. The switched-capacitance amplifier is well suited to this type of application since it processes sampled signals which are precisely the signals delivered by the reading means. Complete integration of a charge-transfer filter can thus be achieved.

What is claimed is:

1. A charge-transfer filter comprising:
a semiconductor substrate;
an insulating layer deposited on the substrate;
an input for applying charges;
electrodes deposited on the insulating layer and constituted alternately by electrodes which are cut into two portions and which are uncut for ensuring charge transfer in the semiconductor by application of given potentials;
means on said substrate for reading quantities of charges which are present beneath the two portions of the cut electrodes and providing two voltages in accordance with said charges;
a switched capacitance differential amplifier on the substrate which receives the voltages delivered by means for reading and produces the output voltage of the filter; wherein this amplifier is constituted by a voltage multiplier comprising n capacitors, periodically switched in parallel and in series by MOS type transistors operating in the switching mode, a single voltage charging simultaneously the n capacitors only when they are switched in parallel and an amplified voltage being obtained between the end terminals of the n capacitors which are simultaneously switched in series.

2. A filter according to claim 1, wherein in the voltage multiplier a first group of transistors G1 carries out switching of the n capacitors in parallel and a second group of transistors G2 carries out switching of said capacitors in series, and wherein switching of both groups of transistors is initiated by two periodic signals $\phi_1$ and $\phi_2$ applied to the gates of the MOS transistors, said signals being such that the two groups of transistors are not simultaneously in the conducting state.

3. A switched capacitance filter comprising at least a filter cell constituted by capacitors and MOS transistors in series with a switched-capacitance amplifier, the output of the amplifier being connected to the cell in a feedback loop; the gain of the amplifier being between 1 and 2; said filter cell comprising four series-connected TMOS transistors each having a source and drain, the input being on the drain of the first transistor and the output being on the source of the last transistor; capacitors being connected between the sources of three of the transistors and ground and between the source of the other transistor and the output of the amplifier; said amplifier is constituted by a voltage multiplier, comprising n capacitors, periodically switched in parallel and in series by MOS type transistors operating in the switching mode, a single voltage from the filter cell charging simultaneously the n capacitors which are switched in parallel, and an amplified voltage being obtained between the end terminals of the n capacitors which are simultaneously switched in series and wherein the capacitors and the transistors of the filter cell and amplifier are integrated on the same semiconductor substrate.

4. A filter according to claim 3, wherein the last capacitor of the filter cell coincides with the first two capacitors of the amplifier.

5. A switched capacitance filter according to claim 3, wherein it comprises two capacitors, periodically switched and wherein the gain of the multiplier is between 1 and 2.

6. A filter according to claim 3, wherein in the voltage multiplier a first group of transistors G1 carries out switching of the n capacitors in parallel and a second group of transistors G2 carries out switching of said capacitors in series, and wherein switching of both groups of transistors is initiated by two periodic signals $\phi_1$ and $\phi_2$ applied to the gates of the MOS transistors, said signals being such that the two groups of transistors are not simultaneously in the conducting state.

7. A filter according to claim 6, wherein the drains and sources of n transistors of the first group G1 (FIG. 1; T11 to T1n) are connected between one of the terminals of each capacitor including the end terminal A and an input (E) to which is applied said charging voltage (VE); the drains and sources of (n−1) other transistors of the first group G1 (FIG. 1; T1 (n+1) to T1 (2n−1)) being connected between the other terminal of each capacitor and ground except for the end terminal B which is connected directly to ground; the drains and sources of (n−1) transistors of the second group G2 (FIG. 1; T21 to T2 (n−1)) being connected between the terminals of two capacitors except for the end terminals A and B.

8. A charge-transfer filter comprising:
a semiconductor substrate;
an insulating layer deposited on the substrate;
electrodes deposited on the insulating layer and ensuring charge transfer in the semiconductor by application of given potentials;
means for reading quantities of charges;
a differential amplifier which receives the voltages delivered by means for reading and produces the output voltage of the filter; wherein this amplifier is constituted by a voltage multiplier comprising n capacitors, periodically switched in parallel and in series by MOS type transistors operating in the switching mode, a single voltage charging simultaneously the n capacitors only when they are switched in parallel and an amplified voltage being obtained between the end terminals of the n capacitors which are simultaneously switched in series and wherein the n capacitors and the transistors are integrated on the same semiconductor substrate;

in the voltage multiplier a first group of transistors G1 carries out switching of the n capacitors in parallel and a second group of transistors G2 carries out switching of said capacitors in series, and wherein switching of both groups of transistors is initiated by two periodic signals $\phi 1$ and $\phi 2$ applied to the gates of the MOS transistors, said signals being such that the two groups of transistors are not simultaneously in the conducting state; and the drains and sources of n transistors of the first group G1 (FIG. 3; T11 to T1n) are connected between one of the terminals of each capacitors including the end terminal A, and an input E1 to which is applied said charging voltage VE+; n other transistors of the first group G1 (FIG. 3; T1 (n+1) to T1 (2n)) being connected between the other terminal of each capacitor including the end terminal B; and a second input E2 to which is applied said charging voltage VE−; the drains and sources of (n−1) transistors of the second group G2 (FIG. 3; T21 to T2 (n−1)) being connected between the terminals of two capacitors except for the end terminals A and B; and an nth transistor of the second group (T2n) being connected between the terminal B and a reference voltage VR for adjusting the offset voltage of the multiplier; thus said multiplier being differential.

9. A circuit comprising at least a filter cell constituted by capacitors and MOS transistors associated to an amplifier, wherein this amplifier is constituted by a voltage multiplier, comprising n capacitors, periodically switched in parallel and in series by MOS type transistors operating in the switching mode, a single voltage charging simultaneously the n capacitors which are switched in parallel and an amplified voltage being obtained between the end terminals of the n capacitors which are simultaneously switched in series and wherein the n capacitors and the transistors are integrated on the same semiconductor substrates, the gain of the multiplier is between 1 and 2; and in said voltage multiplier a first group of transistors G1 carries out switching of the n capacitors in parallel and a second group of transistors G2 carries out switching of said capacitors in series, and wherein switching of both groups of transistors is initiated by two periodic signals $\phi 1$ and $\phi 2$ applied to the gates of the MOS transistors, said signals being such that the two groups of transistors are not simultaneously in the conducting state; the drains and sources of n transistors of the first group G1 (FIG. 1, T11 to T1n) are connected between one of the terminals of each capacitor including the end terminal A and an input (E) to which is applied said charging voltage (VE); the drains and sources of (n−1) other transistors of the first group G1 (FIG. 1; T1 (n+1) to T1 (2n−1)) being connected between the other terminal of each capacitor and ground except for the end terminal B which is connected directly to ground; the drains and sources of (n−1) transistors of the second group G2 (FIG. 1; T21 to T2 (n−1)) being connected between the terminals of two capacitors except for the end terminals A and B; and a capacitor C20 connected between the end terminal A and B.

10. A filter according to claim 8, wherein two integrated capacitors to be switched have the same capacitance value, and each has a first terminal (FIG. 5; B1) and a second terminal, and each has the same stray capacitances Cp1 and Cp2 which are associated with said first and second terminals respectively, capacitance Cp1 being different from Cp2; and wherein the drain and the source of an MOS transistor (T21) of the second group G2 are connected to two like terminals (B1 or B2) of said two capacitors to be switched, the drain and the source of another MOS transistor (T50) being connected between the end terminal A and ground, said transistor being driven by a signal $\phi 4$ applied to its gate and thus permitted to discharge the stray capacitance from the capacitor connected at terminal A within a time internal $\tau$ which elapses between the end of the connection in parallel and the connection in series of the capacitors, and a reference voltage VR being the amplifier ground.

11. A filter according to claim 8, or 10, or 6, or 9 wherein the drain and the source of an MOS transistor T3 are connected between the end terminal A and a node F, and wherein a capacitor C20 is connected between the node F and to the voltage to which the node B is brought when the capacitors are in series, the MOS transistor T3 being operated in the switching mode and being driven by a periodic signal $\phi 3$ applied to its gate, the transistor T3 being triggered into conduction during the time interval in which the capacitors are switched in series by the signal $\phi 2$ in order to permit transfer of the amplified voltage from the terminal A to the node F.

* * * * *